United States Patent

Vidimari et al.

[11] Patent Number: 5,151,914
[45] Date of Patent: Sep. 29, 1992

[54] PROCESS TO MANUFACTURE LASER STRUCTURES WITH LATERAL CONFINEMENT AT VERY LOW THRESHOLD CURRENT AND RELEVANT LASER DEVICES SO OBTAINED

[75] Inventors: Fabio Vidimari, Milan; Sergio Pellegrino, Turin, both of Italy

[73] Assignee: Telettra S.p.A., Italy

[21] Appl. No.: 631,644

[22] Filed: Dec. 21, 1990

[30] Foreign Application Priority Data

Dec. 21, 1989 [IT] Italy .................. 22770 A/89

[51] Int. Cl.$^5$ ............................................. H01S 3/19
[52] U.S. Cl. ................................. 372/46; 372/45
[58] Field of Search ............................. 372/45, 46

[56] References Cited

U.S. PATENT DOCUMENTS 4,523,961  6/1985  Hartman et al. ............... 372/46
4,594,603  6/1986  Holonyak, Jr. .................. 372/46
4,706,254  11/1987  Nojiri et al. ..................... 372/46

Primary Examiner—Georgia Y. Epps
Attorney, Agent, or Firm—Ostrolenk, Faber, Gerb & Soffen

[57] ABSTRACT

A process for producing a multilayer device which emits coherent luminous radiation (laser radiation) upon the application of electric power. The device consists of a substrate, a first epitaxial layer, an active layer having a composition which emits luminous radiation of a desired wavelength, an optical and electric confinement layer, a further optical and electric confinement layer and an electric contact layered structure. To concentrate current flow through the active layer, the adjacent layer is implanted with ions of transition elements, preferably Co or Fe, which, when annealed by thermal treatment, have a high resistivity.

8 Claims, 2 Drawing Sheets

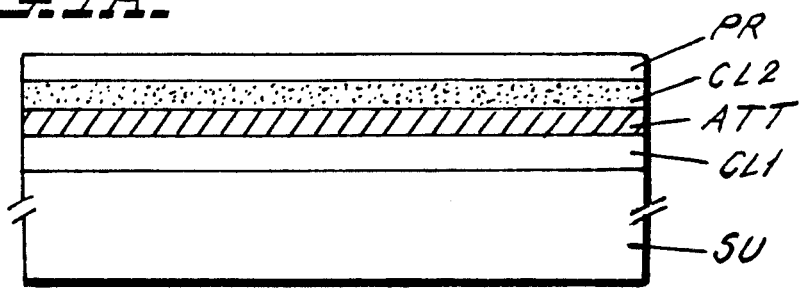
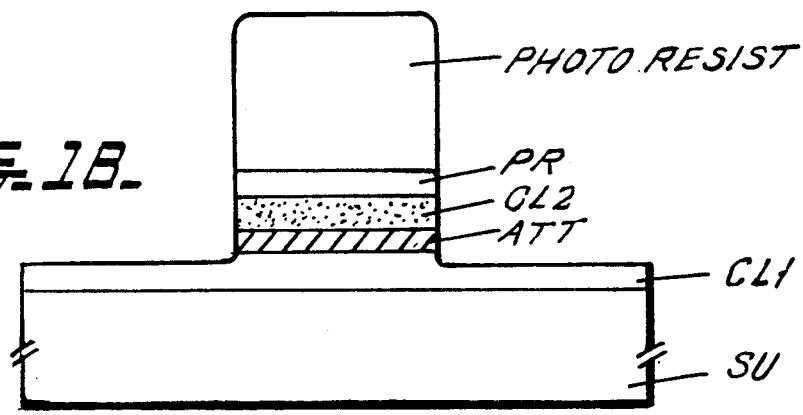
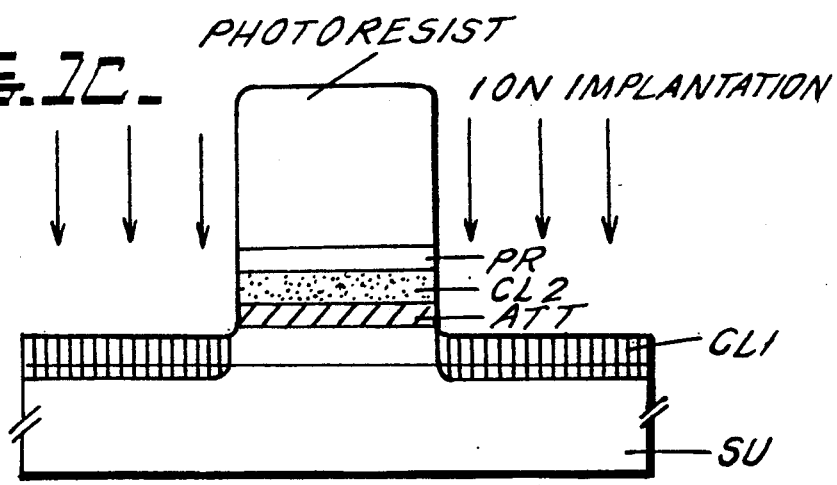
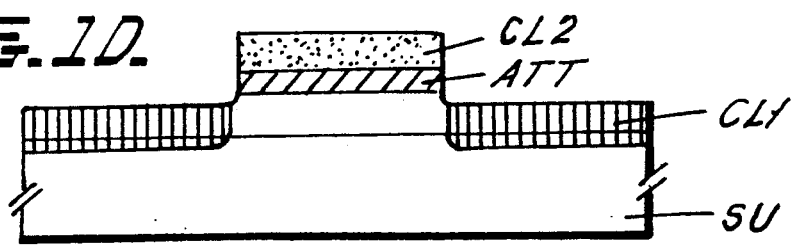

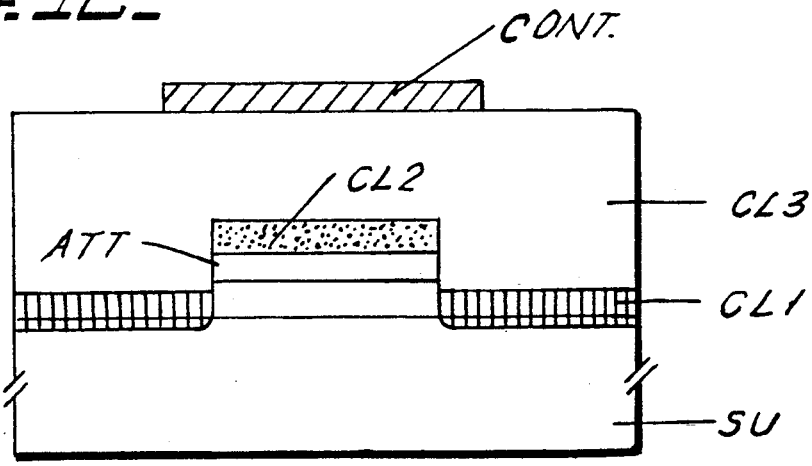
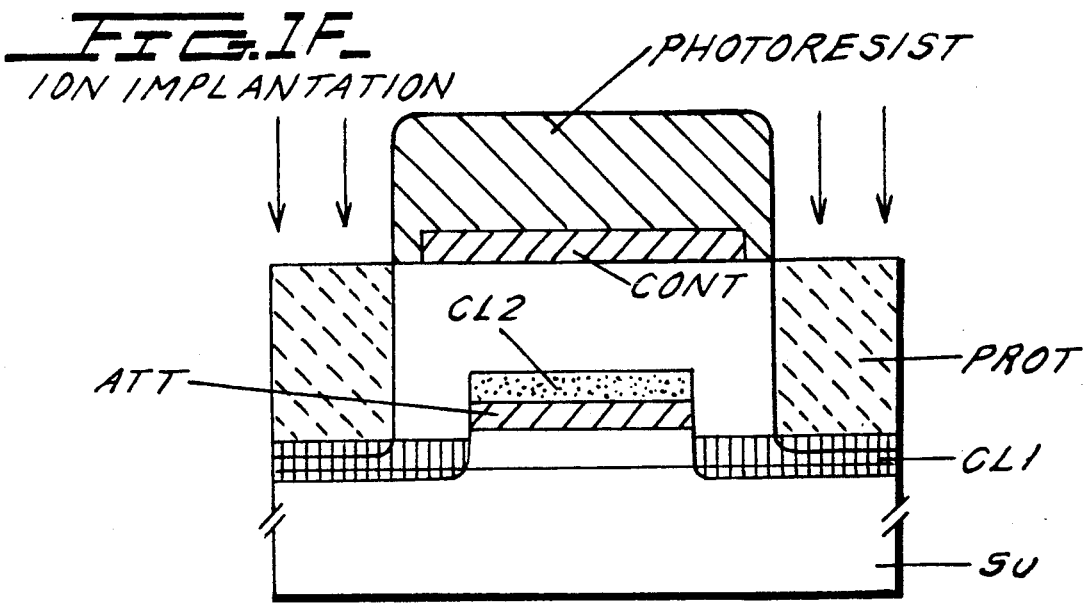
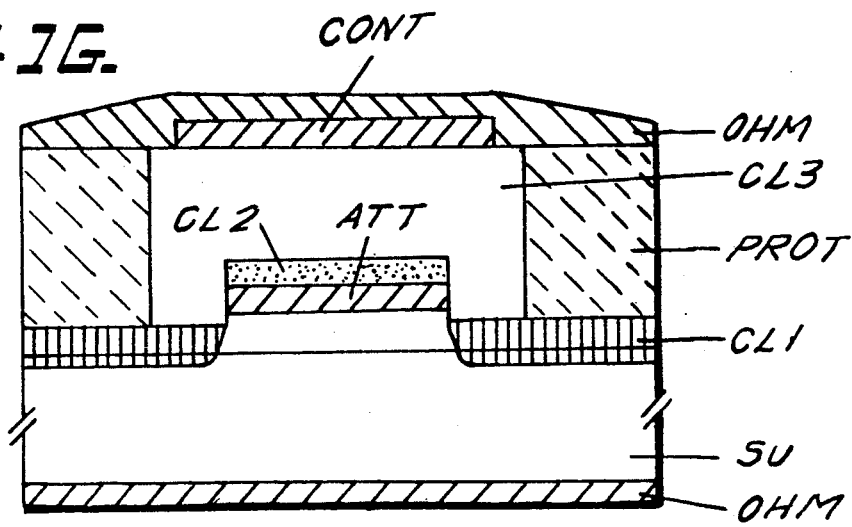

PROCESS TO MANUFACTURE LASER STRUCTURES WITH LATERAL CONFINEMENT AT VERY LOW THRESHOLD CURRENT AND RELEVANT LASER DEVICES SO OBTAINED

BACKGROUND OF THE INVENTION

1. Field of the Invention

The present invention relates to a process for producing a multilayer device which emits coherent luminous radiation (laser radiation) upon the application of electric power. The device is formed of a substrate, a first epitaxial layer, an active layer which emits luminous radiation of a desired wavelength, an optical and electric confinement layer, a further optical and electric confinement layer and an electric contact layer.

2. Description of the Related Art

As is well known, solid-state laser structures emit luminous energy from zones having lateral dimensions on the order of few micrometers. Various methods have been developed for confining the passage of electric energy into the luminous emission region in an effort to obtain the maximum electric-optical conversion efficiency. Currently known methods that are industrially reproduceable and produce high yields involve the use of commercially available semiconductor substrata.

SUMMARY OF THE INVENTION

The objective of the present invention is to provide laser structures with very low threshold current and with high power luminous emission and high modulation speed, by reducing electric paths alternative to the active path.

The process of the invention, which achieves this and other objectives, involves the following steps:

a) onto a substrate layer (Su), e.g. Indium phosphide (InP) or Gallium arsenide (GaAs), an epitaxial layer (CL1) is first grown, again e.g. InP or GaAs; next, an active layer (ATT), e.g. an alloy of Phosphorus (P), Arsenic (As), Gallium (Ga) and/or Indium (In), is grown; next, a layer (CL") of an alloy, e.g. P, As, Ga, In, is grown, preferably covered by a protection layer (PR), e.g. InP or GaAs;

b) a strip of active laser material is made by photolithography and dry or wet etching;

c) the resulting structure is subjected to ion implantation of elements suitable for generating areas of high resistivity outside of the active strip, most importantly in the layer (CL1) of InP or GaAs;

d) the elements implanted in this manner are activated by thermal treatment;

e) a second epitaxial growth is applied onto the structure a), arising from the treatments b)-d) and including a grown layer (CL3), e.g. InP or GaAs and a layer of material suitable for improving the electric contact (CONT) of the formed structure, made of an alloy of Phosphorus (P), Arsenic (As), Gallium (Ga) and/or Indium (In);

f) the completed structure is bombarded with protons (in an area distant from the active layer ATT); and g) the device is completed by the formation of ohmic contacts on the substrate (Su) and on the contact layer (CONT).

Various features and advantages of the invention will be better understood when the following description of the preferred embodiment is read in conjunction with the accompanying drawings.

BRIEF DESCRIPTION OF THE DRAWINGS

FIGS. 1A-1G show the sequence for forming the device of the present invention.

DETAILED DESCRIPTION OF THE PREFERRED EMBODIMENT

In the following description, each of the steps a), b), c), etc. of the process for forming the device is illustrated by a corresponding drawing A), B), C), etc. in FIGS. 1A-1G.

a) First epitaxial growth

The fabrication of the device begins by growing the following layers in series onto a suitable semiconductor substrate (Su), such as Indium phosphide (InP) or Gallium arsenide (GaAs), by Liquid Phase Epitaxy (LPE) or Metal Organic Chemical Vapor Deposition (MOCVD), Chemical Beam-Epitaxy (CBE) techniques or the like:

* a layer CL1 of InP or GaAs having a thickness suitable for creating a layer of physical and optical isolation between the substrate Su and the active layer ATT;

* an active layer ATT of an alloy such as P, As, Ga, In, not intentionally doped, having the same reticular parameter as the layer CL1, and having a composition and thickness suitable for the stimulated emission of photons of a desired wavelength with a low injection current;

* a layer CL2 of doped In, Ga, As, P having the same reticular parameter as the layer ATT, with a doping, composition and thickness suitable for increasing the optical confinement of radiation generated in the layer ATT; and

* a removable "protection" layer made of Indium phosphide or Gallium arsenide (PR) having a thickness of 0.05-0.1 micrometers, suitable for preventing contamination of layer CL2.

b) Definition of strip for creating the active layer bi) Using photolithographic techniques, the photoresist strip that limits the active layer of the laser is created;

bii) the process of transcription onto the semiconductor occurs by erosion made by ion bombardment; the layers PR, CL2, ATT are removed from the areas not protected by photoresist.

c) Ion implantation of types suitable for the electric insulation

The structure resulting from the ionic erosion is subjected to:

ci) An ion implantation of transition elements, preferably Co or Fe, which, when introduced into the layer CL1 and activated by a suitable thermal treatment, form deep energetic levels in the implanted semiconductor, thus inhibiting electric conduction of the same elements or reducing it by many orders of magnitude.

The ion penetration is prevented completely in the areas protected by photoresist (the same areas used as a mask in the step b)), the photoresist having a thickness suitable for guaranteeing the complete absorption of incident ions. Therefore, the implanted areas are self-aligned.

cii) The lateral epitaxial parts ATT and CL2, subjected to ion bombardment with the resultant reduction of conversion efficiency from electrical to optical energy, are removed by wet selective etching.

ciii) The photoresist that limits the strip is removed by suitable solvents.

In the following steps, the layer PR is selectively removed, exposing the surface of layer CL2 and removing a minimum part of the layer CL1 subject to the implantation.

d) Recrystallization and activation of implanted areas

Using a suitable thermal treatment, the implanted areas are brought back to their original crystal structure and the atoms introduced into the structure assume replacement positions in crystal reticule, establishing electron capture centers in the crystal whose concentration is reduced by many orders of magnitude.

This recrystallization process can be conducted as a "separate" treatment before making the second epitaxial growth or can be an integral part of the second epitaxial growth described below:

e) Second epitaxial growth

A layer (CL3) of InP or GaAs, suitable for optical and electrical confinement, is deposited on top of the structure obtained from process steps a)–c).

Finally, a layer (CONT) of P, As, or GaIn is deposited for facilitating the formation of ohmic contacts, described in step g).

g) Proton damage

The structure is selectively bombarded with protons (only the areas distant from the strip of active bombarded area (PROT)) to generate some areas of micrometer depth, where the crystal structure is perturbed and the electric conduction is inhibited.

The purpose of this step is to reduce the parasitic capacity of the device.

g) Ohmic contacts

The device is completed with the formation, by vacuum vaporization and thermal treatment, of ohmic contacts (OHM), that allow the laser to be connected externally.

The laser structure obtained in this manner has a low parasitic capacity and very low threshold current caused by the real absence of parasitic junctions.

The obtained structure has the following notable advantages:

* The current confining structure on the same plane of the pn junction of the laser diode and the self-alignment of the structure increases the concentration of injection current in the active region.

* The reduction of parasitic capacitance also allows an increase of dynamic performance that is again increased by the following proton implantation.

* Finally, it must be emphasized that this structure is made entirely with well known epitaxial growth techniques.

Among other advantages, the produced devices work with very low threshold currents;

the same devices can operate work at high luminous emission powers;

the devices can work at high modulation speeds;

the process allows one to obtain high production yields and, due to the uniformity and homogeneity of the layered structure, a device is obtained which has superior electrical and optical characteristics.

What is claimed is:

1. A process for producing a multilayer structure for emitting coherent luminous radiation comprising a substrate with an electrode formed on one surface and with the following layers, formed in the order recited, on an opposite surface: a first epitaxial layer for optical and electric confinement, an active layer for emitting luminous radiation of a desired wavelength, at least one further layer for optical and electric confinement layer, and an electric contact layer with a second electrode attached thereto, the process including the step of subjecting at least one selected optical and electric confinement layer of said structure to ion implantation, whereby ions of a transition metal are introduced into said selected layer, the active layer of said structure being protected from said ion implantation by a photoresist mask, said implanted ions being activated by thermal treatment, resulting in an increased resistivity in the selected layer of the structure subjected to said ion implantation.

2. A process according to claim 1, wherein said photoresist masking results in the ion implantation being automatically aligned in proximity with the active layer.

3. A process according to claim 1, wherein epitaxial growth is used to form the layers of said multilayer structure.

4. A process according to claim 1, wherein said transition metal comprises Fe.

5. A process according to claim 1, wherein said transition metal comprises Co.

6. A multilayer laser structure, comprising:
a substrate with an electrode formed on one surface and with the following layers, formed in the order recited, on an opposite surface:
a first epitaxial layer for optical and electric confinement;
an active layer for emitting luminous radiation of a desired wavelength;
at least one further layer for optical and electric confinement comprising a semiconductor material implanted with ions of a transition metal;
an electric contact layer; and
a second electrode attached to said electric contact layer.

7. A laser device according to claim 6, wherein said transition metal comprises Fe.

8. A laser device according to claim 6, wherein said transition metal comprises Co.

* * * * *